United States Patent [19]

Nagao et al.

[11] Patent Number: 5,829,126
[45] Date of Patent: Nov. 3, 1998

[54] METHOD OF MANUFACTURING PROBE CARD

[75] Inventors: Koichi Nagao, Osaka; Yoshiro Nakata, Nara; Shinichi Oki, Osaka, all of Japan

[73] Assignee: Matsushita Electric Industrial Co., Ltd., Osaka, Japan

[21] Appl. No.: 638,038

[22] Filed: Apr. 26, 1996

[30] Foreign Application Priority Data

Apr. 28, 1995 [JP] Japan ................................ 7-129054

[51] Int. Cl.⁶ ..................................................... H01R 9/00
[52] U.S. Cl. ................................ 29/843; 29/593; 324/757
[58] Field of Search ............................. 29/846, 825, 843, 29/593; 437/183

[56] References Cited

U.S. PATENT DOCUMENTS

3,835,381  9/1974  Garretson et al. .
4,786,867  11/1988  Yamatsu .
5,008,614  4/1991  Shreeve et al. .
5,356,661  10/1994  Doi et al. .
5,430,614  7/1995  DiFrancesco .
5,545,589  8/1996  Tomura et al. .
5,606,263  2/1997  Yoshizawa et al. .
5,642,055  6/1997  DiFrancesco .

*Primary Examiner*—Carl J. Arbes
*Attorney, Agent, or Firm*—McDermott, Will & Emery

[57] ABSTRACT

Bumps to be connected to inspection electrodes of semiconductor chips are formed on a surface of a flexible substrate. A plating layer is formed which is made of a harder material than the bumps formed on the flexible substrate and which has a concave portion or a convex portion whose diameter is equal to or smaller than half the diameter of the bumps, on a flat metallic plate. The plating layer of the metallic plate is pressed against top surfaces of the bumps, so that irregularities are formed in the top surfaces of the bumps.

7 Claims, 9 Drawing Sheets

| | NO. 1 | NO. 2 | NO. 3 |
|---|---|---|---|
| BUMP HAVING IRREGULARITIES |  |  |  |
| PHOTOGRAPH OF IMPRESSION OF Al ELECTRODE |  |  |  |
| SKETCH OF IMPRESSION OF Al ELECTRODE |  12.3μm / 13.8μm |  14.0μm / 12.7μm |  17.0μm / 18.7μm |

FIG. 7

| | NO. 4 | NO. 5 | NO. 6 |
|---|---|---|---|
| BUMP HAVING IRREGULARITIES |  |  |  |
| PHOTOGRAPH OF IMPRESSION OF Al ELECTRODE |  |  |  |
| SKETCH OF IMPRESSION OF Al ELECTRODE | 15.8 μm / 15.3 μm  | 18.8 μm / 18.9 μm  | 14.7 μm / 18.9 μm  |

METHOD OF MANUFACTURING PROBE CARD

BACKGROUND OF THE INVENTION

The present invention relates to a method of manufacturing a probe card which is used to inspect integrated circuits of a plurality of semiconductor chips which are formed on a semiconductor wafer at the same time.

Recent years have seen a great reduction in size and price of electronic equipment which includes a semiconductor integrated circuit device (hereinafter referred to as "semiconductor device"). In response, a demand for a further reduction in size and price of a semiconductor device has been increasing.

Normally, after electrically connecting a semiconductor chip and a lead frame by a bonding wire, a semiconductor device is completed with the semiconductor chip and the lead frame sealed with a resin or ceramics and is then mounted to a printed substrate. However, to meet the demand for smaller electronic equipment, a method has been developed for directly mounting a semiconductor device to a circuit substrate as it is severed from a semiconductor wafer (A semiconductor device in this condition will be hereinafter referred to as a bare chip.) so that it is possible to supply a bare chip whose quality is guaranteed.

To assure the quality of a bare chip, it is necessary to perform inspection such as burn-in on a semiconductor device as it is formed on a wafer. However, it takes a long time to inspect a plurality of bare chips which are formed on a semiconductor wafer, one by one or for every a few bare chips successively, which is not practical in terms of time and cost. Therefore, it is desirable to perform inspection such as burn-in on all bare chips as they are formed on a wafer.

To perform inspection on all bare chips at the same time as they are formed on a semiconductor wafer, it is necessary to apply a power source voltage or a signal on inspection electrodes of a plurality of semiconductor chips which are formed on a wafer at the same time and to operate the plurality of semiconductor chips at the same time. While an extremely large number of (a few thousands or more in most cases) probe cards each having a probe needle must be prepared to this end, a conventional needle type probe card cannot satisfy this need both with respect to the number of pins and price.

Under the circumstance, a contactor has been proposed which is formed by a thin probe card in which a flexible wiring substrate seats a bump which is connected to an inspection electrode of a semiconductor chip (Nitto Giho, Vol. 28, No. 2 (Oct. 1990), pp. 57–62).

Now, a description will be given on a method of manufacturing such a probe card as above and a method of inspecting a semiconductor device while utilizing such a probe card.

First, after forming an insulation layer on a surface of a metal foil, a through hole is formed in the insulation layer. This is followed by electroplating with one of plating electrodes connected to the metal foil. After growing as if to bury the through hole, a plating layer reaches a surface of the insulation layer and then spreads at the surface equally in radial directions, whereby the plating layer has a semi-spherical shape. This plating layer having a semi-spherical shape serves as a bump which is used for the purpose of inspection. Following this, the gold foil is etched to create a circuit pattern, thereby completing a probe card.

Next, after aligning the probe card to the semiconductor wafer, the probe card is pressed against the semiconductor wafer to contact the bump of the probe card with the inspection electrode of the semiconductor chip. A power source voltage or a signal is then applied on the bump, thereby inspecting the semiconductor device.

By the way, since the inspection electrode of the semiconductor chip is usually formed by metal which easily gets oxidized, such as aluminum, the inspection electrode is covered at its surface with a surface oxidation film such as an alumina film. Therefore, to ensure an excellent electric connection between the bump of the probe card and the inspection electrode of the semiconductor chip, the probe card is pressed against the semiconductor wafer and the surface oxidation film is consequently broken under the pressing force.

Meanwhile, as an increased number of semiconductor chips are formed on a semiconductor wafer, the number of bumps formed on probe cards is increased. Therefore, a decrease in the pressure upon each bump is not avoidable. This makes it impossible to ensure the bumps to steadily break the surface oxidation films, which in turn leads to unevenness in contact resistances between the bumps and the inspection electrodes.

To deal with this, inventors of the present invention considered to reduce a contacting area between the bumps and the inspection electrodes and to accordingly increase a load per unit contacting area even under constant pressure upon per bump, so that it is possible to steadily break the surface oxidation films of the inspection electrodes.

More particularly, as a method of increasing a load per unit contacting area, the inventors of the present invention considered a method in which irregularities are formed on the surfaces of the bumps by plating, a method in which irregularities are formed on the surfaces of the bumps by etching, a method in which irregularities are formed on the surfaces of the bumps by burying fine particles on the surfaces of the bumps, etc.

However, the inventors of the present invention found a first problem that all of these methods fail to create even irregularities on top surfaces of the bumps at a low cost.

Further, a second problem was found that since a probe card is not sufficiently flat while a semiconductor wafer is extremely flat, the top surfaces of the bumps are not often even with each other at the same plane. Due to this, if the semiconductor wafer has a larger diameter and mounts more semiconductor chips, all bumps of the probe card cannot be steadily connected to all inspection electrodes of the semiconductor chips.

SUMMARY OF THE INVENTION

The present invention has been made to solve these problems. Accordingly, a first object of the present invention is to make it possible to form even irregularities on top surfaces of bumps at a low cost so that surface oxidation films of inspection electrodes of semiconductor chips can break without fail, and a second object of the present invention is to ensure that the top surfaces of all bumps of a probe card are even with each other at the same plane so that all bumps of the probe card can be steadily connected to all inspection electrodes of the semiconductor chips.

To achieve the first object as above, a first method of manufacturing a probe card according to the present invention requires to press a top surface of a bump against a substrate which has irregularities and which is made of a harder material than the bump, to thereby form irregularities on the top surface of the bump.

More particularly, a method of manufacturing a probe card for inspecting an electric characteristic of semiconductor chips which are formed on a semiconductor wafer comprises: a bump formation step of forming bumps on a surface of a wiring substrate, the bumps being connected to inspection electrodes of the semiconductor chips; a surface layer formation step of forming a surface layer on a pressing substrate, the surface layer being made of a harder material than the bumps and having a concave portion or a convex portion whose diameter is equal to or smaller than half the diameter of the bumps; and an irregularity formation step of forming irregularities on top surfaces of the bumps by pressing the surface layer of the pressing substrate against the top surfaces of the bumps.

In the first method of manufacturing a probe card, since the concave portion or the convex portion of the surface layer is transferred onto the top surfaces of the bumps when the surface layer which is made of the harder material than the bumps and has the concave portion or the convex portion whose diameter is equal to or smaller than half the diameter of the bumps is pressed against the top surfaces of the bumps, even irregularities are formed on the top surfaces of the bumps. Next, since surface oxidation films of all inspection electrodes of the semiconductor chips break without fail by bumps which seat the even irregularities at the top surfaces when the probe card is pressed against the semiconductor wafer, an excellent electric connection is created between the bumps of the probe card and the inspection electrodes of the semiconductor chips.

Further, since the concave portions and the convex portions which are formed on the surface layer of the pressing substrate are made of a harder material than the bumps, one pressing does not almost deform the pressing substrate, which allows to repeated use of one pressing substrate. Hence, even irregularities are formed on the top surfaces of the bumps only by pressing the pressing substrate which can be used repeatedly, and therefore, a cost of manufacturing the probe card is reduced.

In the first method of manufacturing a probe card, the surface layer formation step preferably comprises a step of forming metallic particles of Ni, Rh, Pd or W or particles of ceramics or $SiO_2$ on the surface of the pressing substrate by plating.

This allows to form irregularities having desired and uniform sizes on the top surfaces of the bumps, and therefore, it is possible to break the surface oxidation films of all inspection electrodes of the semiconductor chips more steadily without fail.

In the first method of manufacturing a probe card, the surface layer formation step preferably comprises a step of fixing particles of Ni, Rh, Pd or W on the surface of the pressing substrate by an adhesive agent.

This allows to form irregularities having desired and uniform sizes on the top surfaces of the bumps, and therefore, it is possible to break the surface oxidation films of all inspection electrodes of the semiconductor chips more steadily without fail.

The first method of manufacturing a probe card preferably further comprises a step of forming a plating layer which is made of a harder material than the bumps on the surface of the bumps in which irregularities are formed in the tip surfaces.

Since this makes it difficult for the irregularities on the top surfaces of the bumps to get worn away, the probe card has a long life.

In the first method of manufacturing a probe card, the irregularity formation step preferably comprises a step of pressing the surface layer of the pressing substrate against the top surfaces of the bumps successively two or more times, and this step preferably includes a step of changing the position of the pressing substrate which is to be brought into a contact with the bumps for every pressing.

Since the surface of the pressing substrate is pressed against the top surfaces of the bumps successively two or more times while shifting the position of the pressing substrate, it is possible to form irregularities of uniform and desired diameters on the top surfaces of the bumps. Hence, the surface oxidation films of all inspection electrodes of the semiconductor chips can break even more steadily.

To achieve the second object as above, a second method of manufacturing a probe card according to the present invention requires deformation of an inter-layer insulation film having a plastic behavior in such a manner that the top surfaces of the bumps are even with each other at the same plane.

More particularly, a method of manufacturing a probe card for inspecting an electric characteristic of semiconductor chips which are formed on a semiconductor wafer comprises: a step of forming bumps to be connected to inspection electrodes of semiconductor chips on a wiring substrate, which includes an inter-layer insulation film between a metallic wire of a lower layer and a metallic electrode of an upper layer or between a base material and the metallic electrode, so that the bumps and the metallic electrode of the upper layer are electrically connected to each other; and a step of pressing tips of the bumps against a flat substrate to thereby locates the tops of the bumps even with each other at the same plane, while maintaining the wiring substrate seating the bumps at such a temperature at which the inter-layer insulation film softens.

When the tops of the bumps are pressed against the flat substrate while maintaining the wiring substrate seating the bumps at such a temperature at which the inter-layer insulation film softens, the inter-layer insulation film is deformed so that the tops of the bumps are even with each other at the same plane. Following this, when the temperature of the flexible substrate is returned to a normal temperature, the inter-layer insulation film softens while remaining in such a condition which locate the tops of the bumps even with each other at the same plane. In this case, since the temperature at which the inter-layer insulation film softens is higher than a burn-in temperature, the inter-layer insulation film which deformed due to a plastic behavior does not deform once again during burn-in. This allows excellent burn-in to be performed.

DESCRIPTION OF THE PREFERRED EMBODIMENTS

In the following, a description will be given on a method of manufacturing a probe card according to a preferred embodiment of the present invention, with reference to FIGS. 1A to 1C and 2.

Figure 1A:
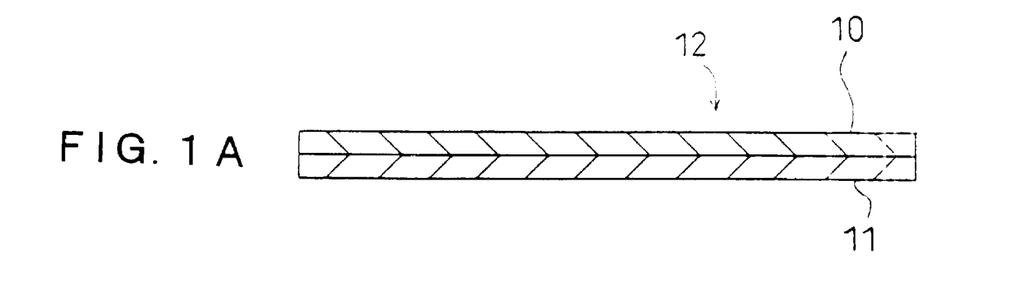
FIGS. 1A to 1C are cross sectional views for describing steps during a method of manufacturing a probe card according to a preferred embodiment of the present invention.

First, a bump to be connected to an inspection electrode of a semiconductor chip is formed on a surface of a flexible wiring substrate.

As shown in FIG. 1A, after casting polyimide (or polyimide precursor) on one surface of a copper foil 10 which has a thickness of about 18 $\mu$m, polyimide is heated, dried and hardened to form a polyimide layer 11. The thickness of the polyimide layer 11 after hardened is about 25 $\mu$m. Since the thermal expansion rate of polyimide is approximately the same as that of copper ($16 \times 10^{-6}$/° C.), warping of the flexible wiring substrate 12 which is formed by the copper foil 10 and the polyimide layer 11 due to heat history is small.

Figure 1B:
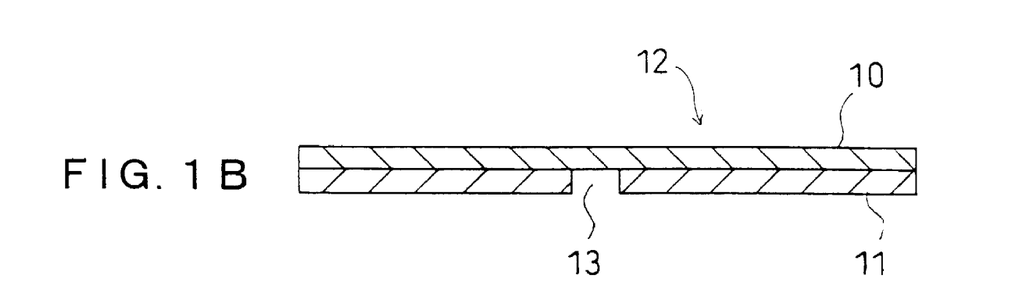

Following this, as shown in FIG. 1B, a through hole 13 having a diameter of about 30 $\mu$m is formed in the polyimide layer 11. After coating the other surface of the copper foil 10 with a resist (not shown), one of plating electrodes is connected to the copper foil 10 to perform electroplating of Ni. Since the other surface of the copper foil 10 is coated with the resist, Ni is not plated. A plating layer is formed to fill up the through hole 13, reaches a surface of the polyimide layer 11, and spreads equally in radial directions to form a semi-spherical shape, whereby a bump 14 having a diameter of about 45 $\mu$m is formed.

Figure 1C:
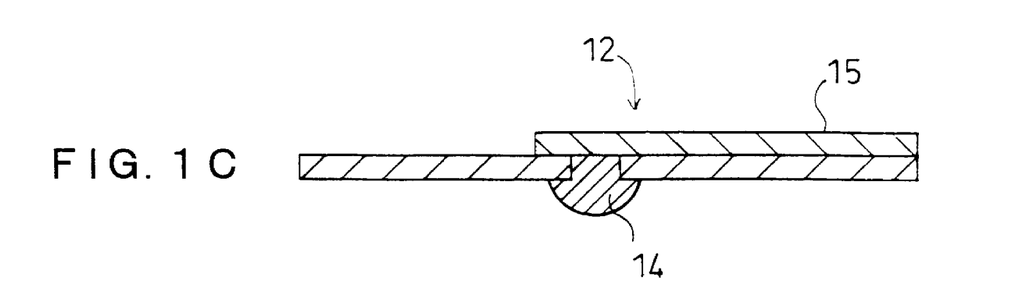

After removing the resist which covers the other surface of the copper foil 10, the copper foil 10 is etched by a known method as shown in FIG. 1C to thereby define a circuit pattern 15.

Besides the flexible wiring substrate as above, the wiring substrate may be a wiring substrate which uses silicon, glass, ceramics, glass epoxy or the like as a base material (hereinafter referred to simply as "hard substrate").

Next, a surface portion having a convex or a concave portion is formed on a pressing substrate.

A metallic plate made of copper, for example, is electrically plated at a surface, whereby a plating layer of Ni having a particle diameter of about 1 to 10 $\mu$m is formed as a surface layer. The particle diameter of Ni particles in this plating layer can be controlled by changing an additive agent to plating liquid and the current density. That is, while saccharin or the like is used as an additive agent in general to reduce the particle diameter of Ni particles which are grown by plating, when the quantity of the additive agent is decreased, the particle diameter of the Ni particles becomes small. Meanwhile, the particle diameter becomes small when the current density is reduced but becomes large when the current density is increased. Hence, by changing an additive agent to the plating liquid and the current density, a plating layer which is formed by particles each having a diameter of about 1 to 10 $\mu$m can be formed.

Figure 2:
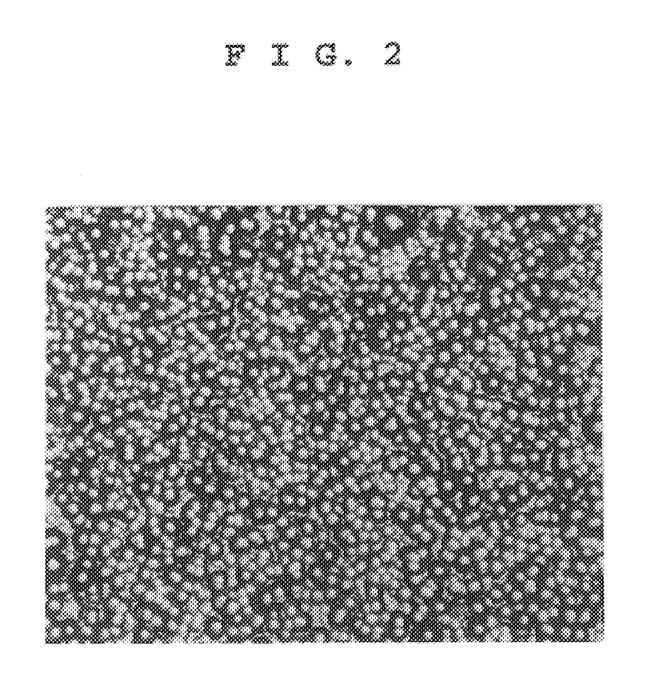
FIG. 2 is a photograph of a thin film which is formed by Ni particles which are formed on a surface of a metallic plate during the method of manufacturing a probe card according to the preferred embodiment.

FIG. 2 is an expanded photograph showing a distribution condition of the Ni plated particles. The illustrated case is where the particle diameter is about 5 to 10 $\mu$m and the distribution of the particles is dense and uniform.

A method of forming the surface layer having a convex or a concave portion on the pressing substrate may not be electroplating. Rather, a surface of the pressing substrate formed by a glass plate may be rubbed with sand to form irregularities each having a particle diameter of about 1 to 10 $\mu$m, or particles having a diameter of about 1 to 10 $\mu$m may be uniformly adhered to a surface of the pressing substrate.

Figure 3A:
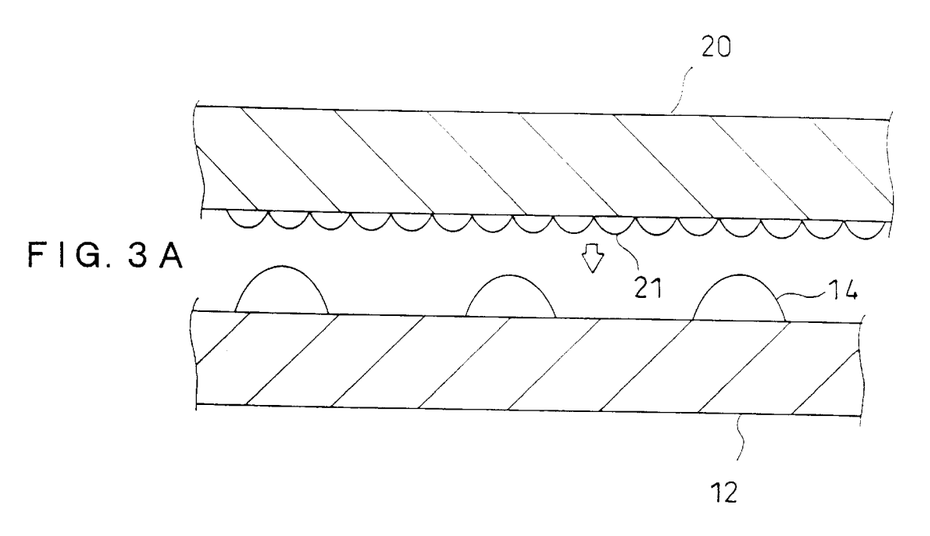
FIGS. 3A and 3B are cross sectional views for describing steps during the method of manufacturing a probe card according to the preferred embodiment.
Figure 3B:
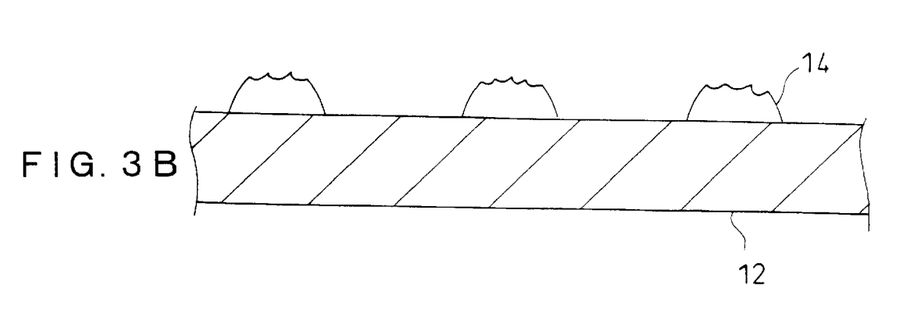

Next, the surface layer of the pressing substrate is pressed against a top surface of the bump 14, to form irregularities on the top surface of the bump 14.

When a plating layer 21 having a particle diameter of about 3 to 10 $\mu$m which is formed on a surface of a metallic plate 20 is pressed against the bump 14 of the flexible wiring substrate 12 as shown in FIG. 3A, irregularities are formed on the top surface of the bump 14 as shown in FIG. 3B.

The pressure which is applied at this stage is 5 to 50 g per bump where the bump is an Au bump which has a diameter of 40$\mu$m. Preferably, the pressure is 15 to 25 g. With respect to the number of pressings, while it is possible to irregularities which are close to those desired by applying pressure once, irregularities can be formed more uniformly when pressure is applied twice to three times repeatedly. When pressure is applied for a plurality of times, the position of the metallic plate 20 is preferably shifted for every pressing, so that the bump 14 does not contact the same part of the plating layer 21 which is formed on the metallic plate 20.

Next, a surface protection film which is formed by a plating layer is formed in the tip surface of the bump 14.

The type of plating may be electrolytic plating or electroless plating. A metallic material of the plating layer is Rh which is harder than Ni, Ni, Pd, W or the like. The thickness of the plating layer is preferably 1 $\mu$m or smaller so as not to hide the irregularities which are formed in the tip surface of the bump 14.

Now, a description will be given on a method of manufacturing a probe card which is formed by a hard substrate, which uses silicon, glass, ceramics, glass epoxy or the like as a base material, and bumps.

Since a hard substrate is not flat enought, the hard substrate is used after being leveled (i.e., flattened). While the flatness of a hard substrate is different depending on a base material and a manufacturing method, in general, the flatness is about 0.01 to 1% of the size of the substrate. A substrate having a size of 150 mm×150 mm has a few ten $\mu$m or larger irregularities. Further, while the heights of bumps are different depending on a method of forming the bumps, differences in height are about 1 to 5 $\mu$m in an area of 150 mm×150 mm. Since a probe card can not be regarded flat while a semiconductor wafer is extremely flat, all bumps of the probe card can not be always connected without fail with inspection electrodes of semiconductor chips at one time. Therefore, the probe card is levelled so that the bumps and the inspection electrodes are connected to each other without fail at the same time.

Figure 9A:
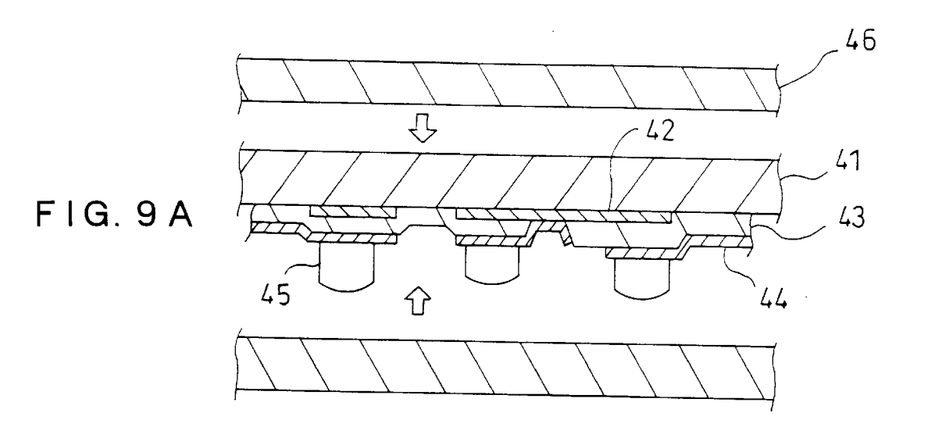
FIG. 9A and 9B are a cross sectional views for describing steps during the method of manufacturing a probe card according to the preferred embodiment of the present invention.
Figure 9B:
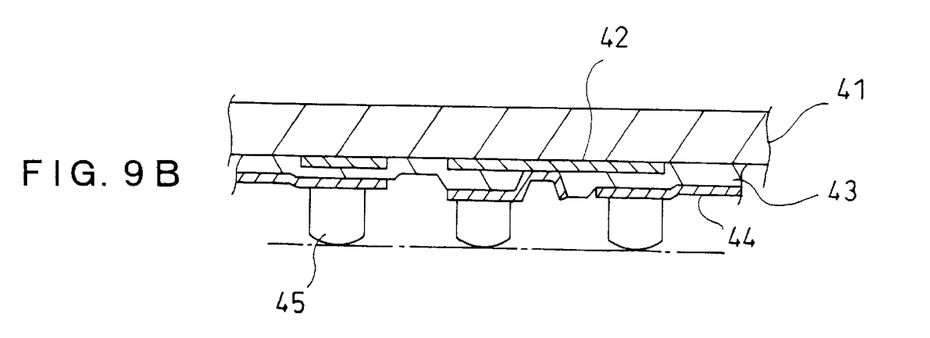

In the following, a method of levelling will be described with reference to FIG. 9.

First, a metallic electrode 44 is formed on a glass substrate 41 through a metallic wire 42 and an inter-layer insulation film 43. An epoxy resin, a polymide resin or the like is used as the inter-layer insulation film 43.

Next, bumps 45 are formed on the metallic electrode 44, using a photosensitive resist, etc. Tops of the bumps 45 are not even with each other at the same plane. Rather, the positions of the tops vary by a few ten to a few hundred $\mu$m. A major cause is a variation in the flatness of the glass substrate 41, a variation in the thickness of the inter-layer insulation film 43, a variation in the heights of the bumps 45, etc.

The probe card which is formed by the hard substrate and the bumps is heated to about 180° C., for instance, as it is held between a pair of flat substrates. This softens the inter-layer insulation film between the metallic wire of a lower layer and the metallic electrode of an upper layer or between the base material and the metallic electrode within the probe card, so that the positions of the tops of the bumps are at the same plane. Since the inter-layer insulation film is deformed due to a plastic behavior, even if the probe card is cooled to a normal temperature, the tops of the bumps remain even with each other at the same plane.

Now, a description will be given on the evaluation test which was performed to evaluate the present invention.

Figure 4:
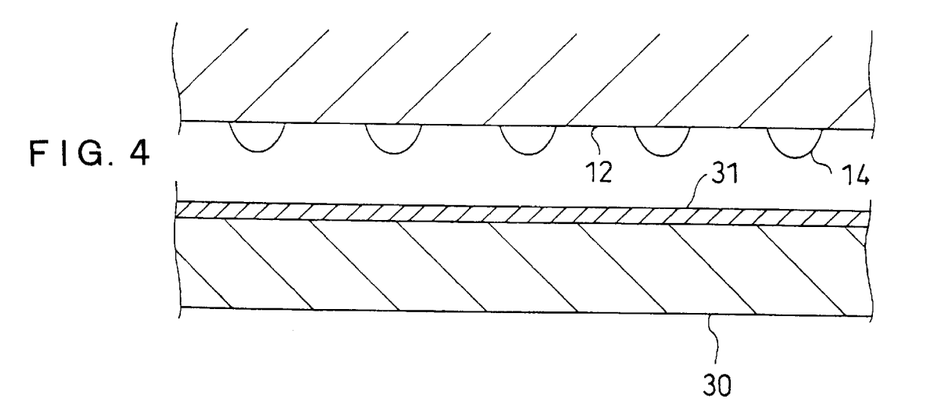
FIG. 4 is a cross sectional view showing a method of the evaluation test which was performed to evaluate the present invention.

FIG. 4 shows a method of pressing the bumps 14 having irregularities at top surfaces against an alumina layer 31 which is formed on a surface of an aluminum electrode 30. A pressing load in this case is about 10 g per bump.

Figure 5:
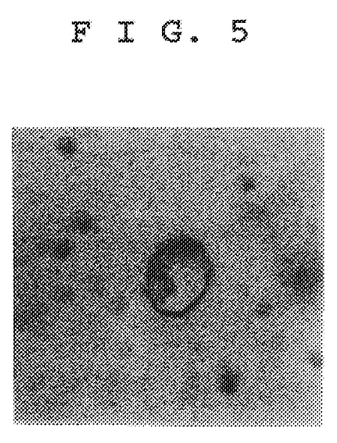
FIG. 5 is a photograph of a thin film which shows the shape of an impression which is created when a bump formed by a conventional method of manufacturing a probe card is pressed against an aluminum electrode.

FIG. 5 shows an impression which is formed on the alumina layer when a conventional semi-spherical bump is pressed against the aluminum electrode. A pit having a well-defined configuration is formed on the aluminum electrode, and the alumina layer is not sufficiently broken through.

Figure 6:
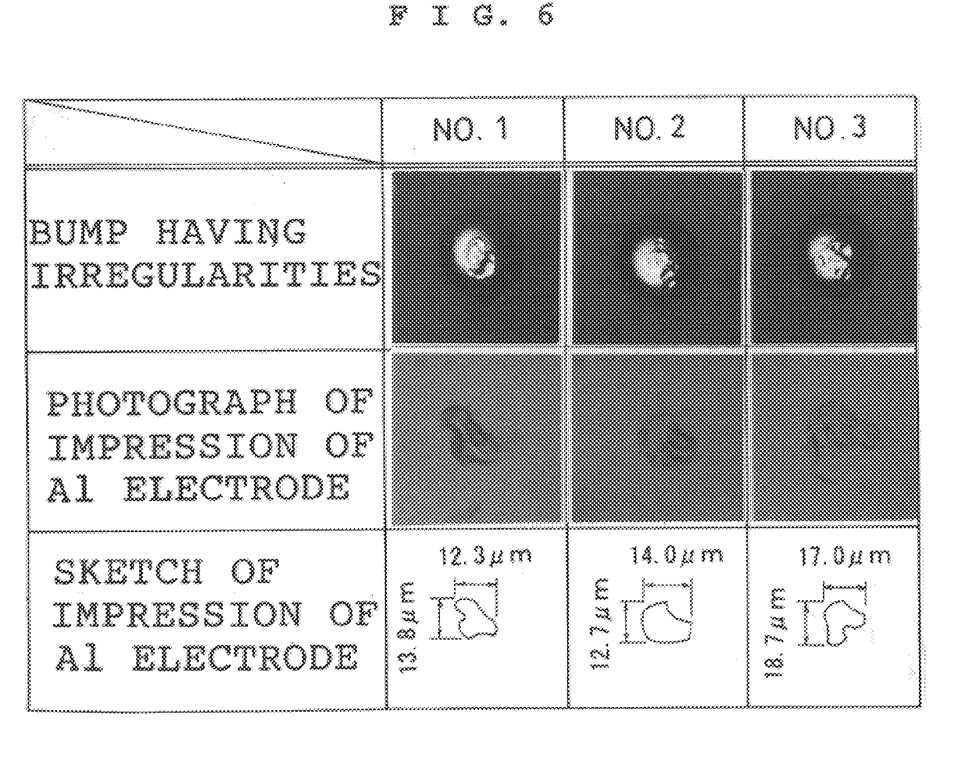
FIG. 6 is a photograph of a thin film of a surface of a bump which is formed by the manufacturing a probe card according to the preferred embodiment, a photograph and a sketch of the same of a thin film showing the shapes of impressions which are created when the bump above is pressed against an aluminum electrode.
Figure 7:
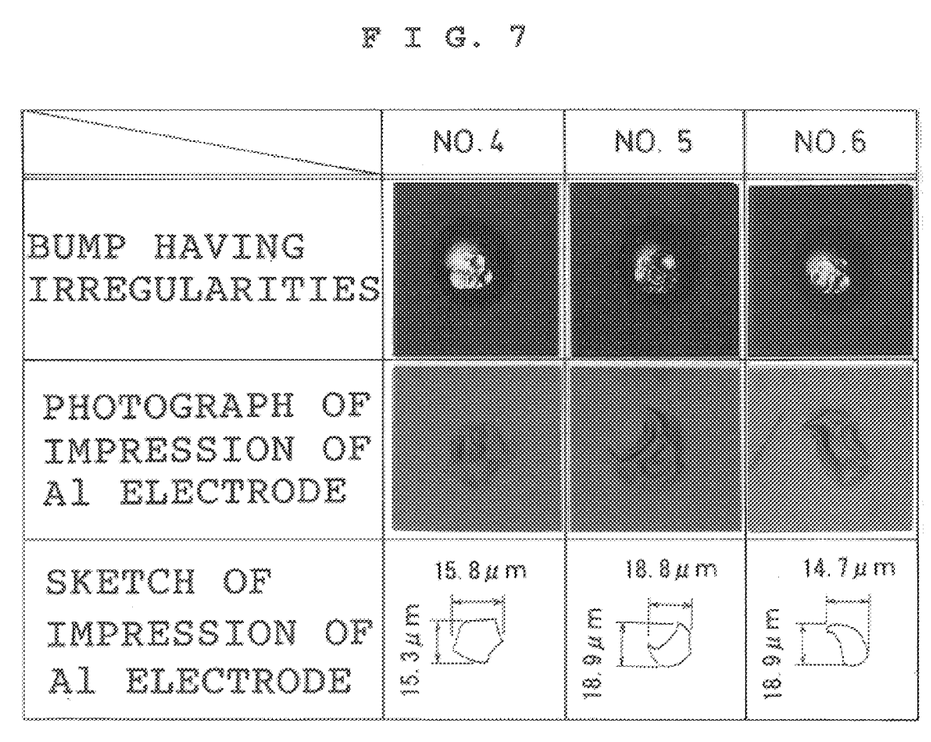
FIG. 7 is a photograph of a thin film of a surface of a bump which is formed by the method of manufacturing a probe card according to the preferred embodiment, a photograph and a sketch of the same of a thin film showing the shapes of impressions which are created when the bump above is pressed against an aluminum electrode.

FIGS. 6 and 7 show impressions which are formed on the alumina layer when bumps which are manufactured according to the preferred embodiment above are pressed against the aluminum electrode. In any one of samples numbered from No. 1 through No. 6, a pit having a complex configuration is formed on the aluminum electrode, and the alumina layer is sufficiently broke through.

Figure 8:
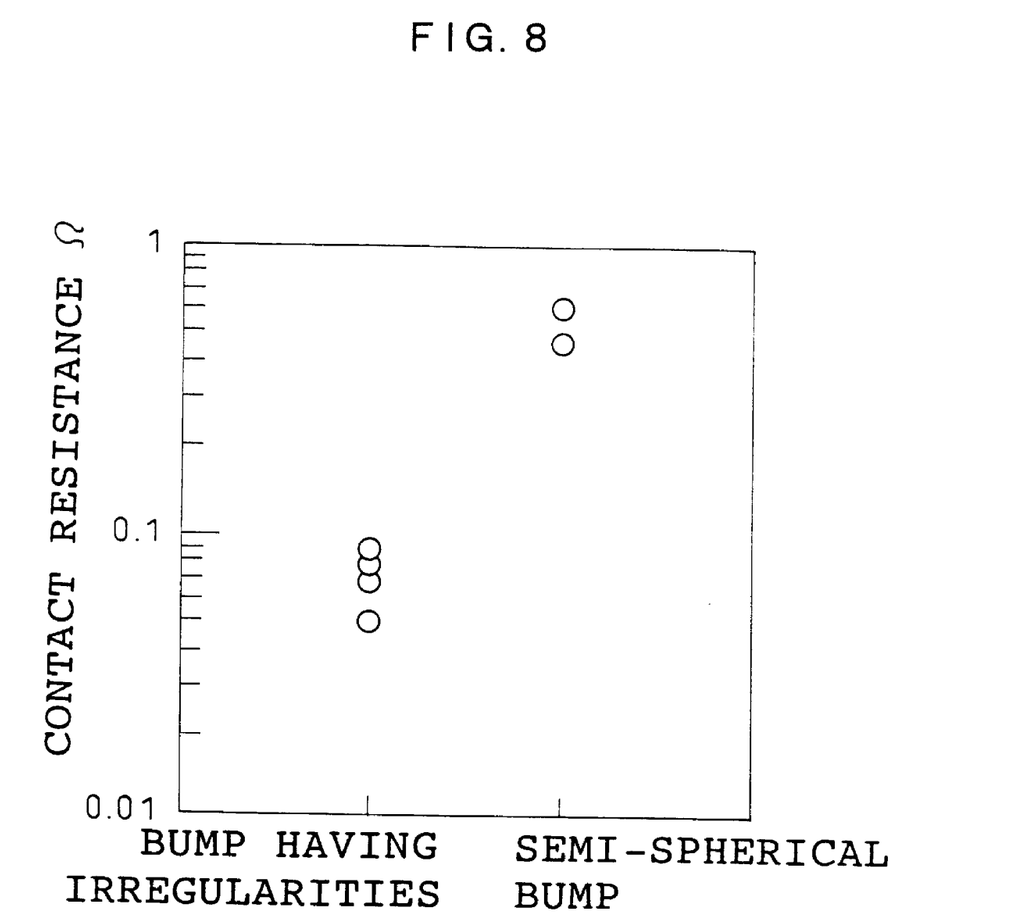
FIG. 8 is a view showing a relationship between a contact resistance and the shapes of bumps which are formed by the conventional method of manufacturing a probe card and the method of manufacturing a probe card according to the preferred embodiment.

FIG. 8 shows a contact resistance which is measured where a conventional semi-spherical bump having a diameter of 40 $\mu$m (described as "SEMI-SPHERICAL BUMP" in the drawing) and a bump which is manufactured according to the preferred embodiment above to have a diameter of 40 $\mu$m (described as "BUMP HAVING IRREGULARITIES" in the drawing) are pressed against inspection electrodes of aluminum each having a thickness of 1 $\mu$m, each at pressure of 10 g per bump. The measuring current is 1 mA. As can be clearly understood from FIG. 8, a contact resistance is largely reduced in the case of the bump manufactured according to the preferred embodiment than in the case of the conventional bump.

What is claimed is:

1. A method of manufacturing a probe card for inspecting an electric characteristic of semiconductor chips which are formed on a semiconductor wafer, comprising:

a bump formation step of forming bumps on a surface of a wiring substrate, said bumps being connected to inspection electrodes of said semiconductor chips; ; and an irregularity formation step of forming irregularities on tops of said bumps by pressing the tops of said bumps against a pressing substrate having a surface which is made of a harder material than said bumps and has concave or convex portions each having a diameter equal to or smaller than half the diameter of said bumps.

2. The method of manufacturing a probe card of claim 1, wherein said surface of said pressing substrate is formed by putting particles of Ni, Rh, Pd, W, ceramics, or $SiO_2$ on the surface of said pressing substrate by plating.

3. The method of manufacturing a probe card of claim 1, wherein said surface of said pressing substrate is formed by fixing particles of Ni, Rh, Pd or W on the surface of said pressing substrate by an adhesive agent.

4. The method of manufacturing a probe card of claim 1, further comprising a step of forming a plating layers which is made of a harder material than said bumps, on surfaces of said bumps having irregular tops.

5. The method of manufacturing a probe card of claim 1, wherein said irregularity formation step comprises two or more successive steps of pressing the surface of said pressing substrate against the tops of said bumps, wherein this step includes a step of changing the position of said pressing substrate, which is to contact said bumps, with respect to the position of the probe card of a previous pressing step, after every pressing step.

6. A method of manufacturing a probe card for inspecting an electric characteristic of semiconductor chips which are formed on a semiconductor wafer, said probe card including a plurality of bumps having tops to be respectively connected to a plurality of inspection electrodes formed on said semiconductor chips, comprising:

a step of forming said plurality of bumps respectively on a plurality of metallic electrodes on a wiring substrate, said wiring substrate including:
   a substrate;
   said plurality of metallic electrodes, and
   an insulation film interposed between said substrate and said plurality of metallic electrodes ; and a step of pressing tops of said bumps against a flat plate to thereby evenly locate the tops within the same plane, while maintaining said wiring substrate seating said bumps at such a temperature at which said insulation film softens.

7. The method of manufacturing a probe card of claim 1, wherein said surface of said pressing substrate is formed by rubbing said surface of said pressing substrate with sand.

* * * * *

UNITED STATES PATENT AND TRADEMARK OFFICE
CERTIFICATE OF CORRECTION

PATENT NO. : 5,829,126
DATED : November 3, 1998
INVENTOR(S) : Koichi NAGAO et al.

It is certified that error appears in the above-identified patent and that said Letters Patent is hereby corrected as shown below:

<u>Col. 8</u>,

Line 28, delete "layers" and insert --layer,--.

Signed and Sealed this

Twenty-fifth Day of May, 1999

Attest:

Q. TODD DICKINSON

*Attesting Officer*      *Acting Commissioner of Patents and Trademarks*